United States Patent
Hosaka et al.

(10) Patent No.: US 9,589,771 B2
(45) Date of Patent: Mar. 7, 2017

(54) PLASMA PROCESSING APPARATUS

(75) Inventors: Yuki Hosaka, Kurokawa-gun (JP);
Naokazu Furuya, Kurokawa-gun (JP);
Mitsunori Ohata, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1156 days.

(21) Appl. No.: 13/410,994

(22) Filed: Mar. 2, 2012

(65) Prior Publication Data

US 2012/0222814 A1 Sep. 6, 2012

Related U.S. Application Data

(60) Provisional application No. 61/466,155, filed on Mar. 22, 2011.

(30) Foreign Application Priority Data

Mar. 3, 2011 (JP) .................................. 2011-046769

(51) Int. Cl.
C23F 1/00 (2006.01)
H01L 21/306 (2006.01)
H01J 37/32 (2006.01)

(52) U.S. Cl.
CPC ................................ H01J 37/3244 (2013.01)

(58) Field of Classification Search
CPC .................................................. H01J 37/3244
USPC ...................................................... 156/345.29
See application file for complete search history.

(56) References Cited

U.S. PATENT DOCUMENTS

| | | | | |
|---|---|---|---|---|
| 5,462,775 | A | * | 10/1995 | Yamada ................ C23C 16/325 427/255.7 |
| 6,261,408 | B1 | * | 7/2001 | Schneider et al. ........ 156/345.26 |
| 2002/0003126 | A1 | * | 1/2002 | Kumar et al. ................... 216/67 |
| 2003/0227258 | A1 | * | 12/2003 | Strang et al. ............. 315/111.21 |
| 2007/0266945 | A1 | * | 11/2007 | Shuto .................. C23C 16/4585 118/723 E |
| 2009/0236041 | A1 | * | 9/2009 | Iizuka ....................... 156/345.34 |
| 2010/0243608 | A1 | * | 9/2010 | Koshimizu ...................... 216/67 |
| 2012/0000886 | A1 | * | 1/2012 | Honda et al. .................... 216/24 |
| 2012/0031559 | A1 | * | 2/2012 | Dhindsa et al. .......... 156/345.26 |

FOREIGN PATENT DOCUMENTS

| | | |
|---|---|---|
| JP | 2003-086580 | 3/2003 |
| JP | 2003-514386 | 4/2003 |
| WO | 01/37311 | 5/2001 |

* cited by examiner

*Primary Examiner* — Keath Chen
(74) *Attorney, Agent, or Firm* — Cantor Colburn LLP

(57) ABSTRACT

Disclosed is a plasma processing apparatus capable of more accurately controlling plasma. The plasma processing apparatus includes a shower head provided within a processing chamber, in which a substrate accommodated therein is processed, to be faced to a mounting table for mounting the substrate and supply gas from a plurality of gas discharging holes provided on a facing surface that faces the mounting table toward a substrate in a shower pattern; a plurality of exhaust holes that passes through a surface located at an opposite side to the facing surface of the shower head; a circular plate-like body that is disposed parallel to the opposite surface in a exhaust space that communicates with the exhaust holes distributed at the opposite surface and made of a conductive material; and a moving unit configured to move the plate-like body to change a distance between the exhaust holes and the plate-like body.

12 Claims, 2 Drawing Sheets

PLASMA PROCESSING APPARATUS

CROSS-REFERENCE TO RELATED APPLICATIONS

This application is based on and claims priority from Japanese Patent Application No. 2011-046769, filed on Mar. 3, 2011, with the Japanese Patent Office, the disclosure of which is incorporated herein in its entirety by reference. Also, this application claims the benefit of U.S. Provisional Application No. 61/466,155 filed on Mar. 22, 2011, with the United States Patent and Trademark Office, the disclosure of which is incorporated herein in its entirety by reference.

TECHNICAL FIELD

The present disclosure relates to a plasma processing apparatus.

BACKGROUND

In the field of, for example, manufacture of a semiconductor device, a plasma processing apparatus that performs an etching process or a film forming process by activating plasma on a substrate such as a semiconductor wafer has been used.

In such a plasma processing apparatus, a configuration is known in which a magnetic field is formed in a processing space by a magnet provided around a processing chamber to control the plasma in the processing space. See, for example, Japanese Patent Application Laid-Open No. 2003-86580. Further, there is known a technology in which a magnetic field is formed in a portion to which gas is exhausted from the processing chamber by a magnet to prevent the plasma from being passed while allowing the gas to pass, thereby trapping the plasma in the processing space. See, for example, Japanese Patent Application Laid-Open No. 2003-514386.

In the plasma processing apparatus as described above, the plasma is controlled or trapped in the processing space by a magnetic field formed within the processing space.

In the meantime, since a collective etching on a multi-layered structure recently becomes a main stream in the semiconductor device manufacturing field, it is necessary to perform plural processings in a single processing chamber. Therefore, it is required to accurately control the plasma according to the individual processing conditions.

BRIEF SUMMARY OF THE INVENTION

The present disclosure has been made in an effort to provide a plasma processing apparatus that is capable of more accurately controlling the plasma as compared with the related art.

An exemplary embodiment of the present disclosure provides a plasma processing apparatus including: a shower head provided within a processing chamber, in which a substrate accommodated therein is processed, to be faced to a mounting table for mounting the substrate and supply gas from a plurality of gas discharging holes provided on a facing surface facing the mounting table toward the substrate in a shower pattern; a plurality of exhaust holes that passes through a surface located at an opposite side to the facing surface of the shower head; a circular plate-like body that is disposed parallel to the opposite surface in a exhaust space communicating with the exhaust holes distributed at the opposite surface and made of a conductive material; and a moving unit configured to move the plate-like body to change a distance between the exhaust holes and the plate-like body.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings.

Figure 1:
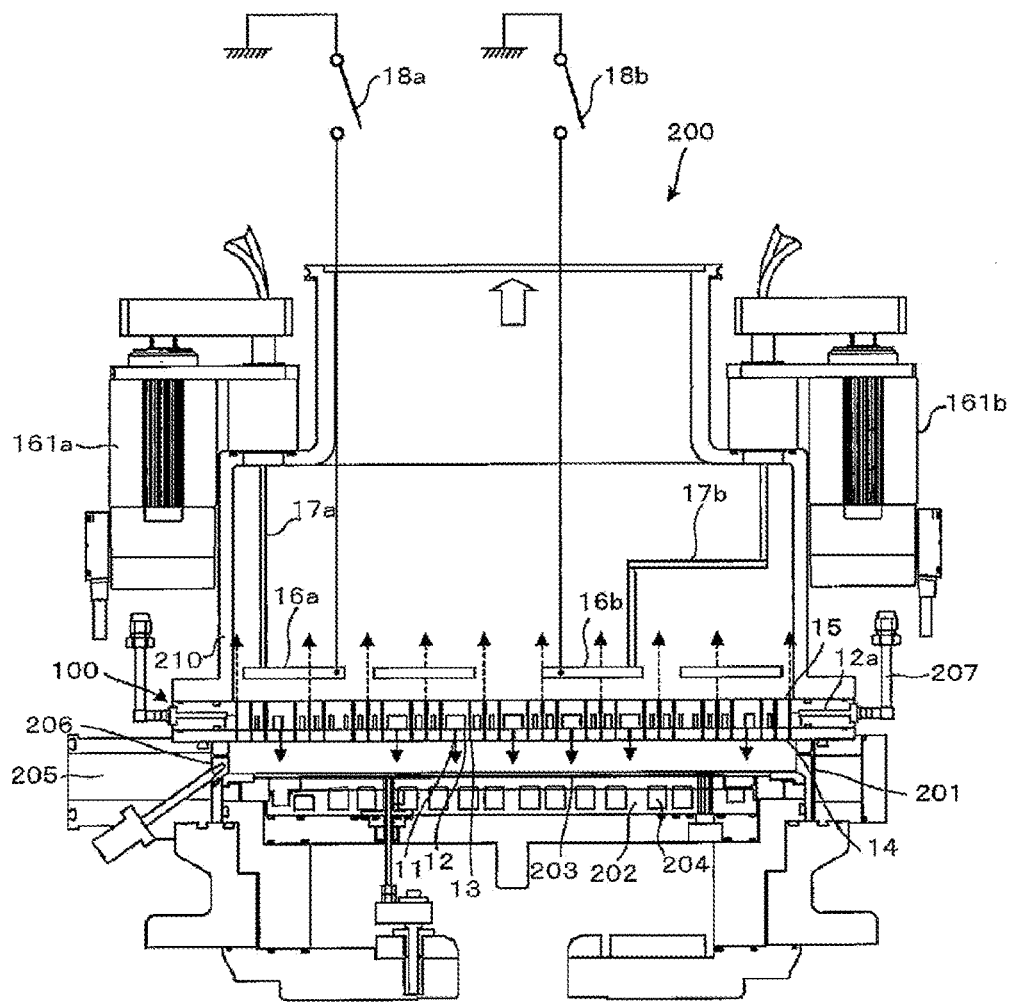
FIG. 1 is a longitudinal sectional view schematically illustrating a configuration of a plasma processing apparatus according to an exemplary embodiment of the present disclosure.

FIG. 1 schematically illustrates a cross-sectional configuration of a plasma etching device 200 according to an exemplary embodiment of the plasma processing apparatus of the present disclosure.

As shown in FIG. 1, the plasma etching device 200 includes a processing chamber (processing container) 201 which is grounded and formed in a cylindrical shape and made of aluminum whose surface is anodically oxidized. In the processing chamber 201, a semiconductor wafer which is a substrate to be processed is disposed and a mounting table 202 that constitutes a lower electrode is provided. One or plural power supplies are connected to the mounting table 202 for forming plasma (not shown).

An electrostatic chuck 203 is provided on an upper side of the mounting table 202 so as to electrostatically adsorb the semiconductor wafer thereon. The electrostatic chuck 203 is configured by disposing an electrode between insulators, and the semiconductor wafer is electrostatically adsorbed by a Columbic force generated by a DC voltage applied to the electrode. Further, a flow passage 204 is formed on the mounting table 202 to circulate a temperature adjustment medium to control the temperature of the semiconductor wafer adsorbed onto the electrostatic chuck 203 to be a predetermined temperature. At the side wall of the processing chamber 201, an opening 205 is formed to carry the semiconductor wafer in or out the processing chamber 201. An opening and closing mechanism 206 that air-tightly seals the opening 205 is provided.

A shower head 100 is disposed at the upper side of the mounting table 202 to be faced to mounting table 202 with a predetermined distance between the mounting table 202 and the shower head 100. Therefore, a pair of opposite electrodes are formed such that the shower head 100 serves as an upper electrode and the mounting table 202 serves as a lower electrode.

Figure 2:
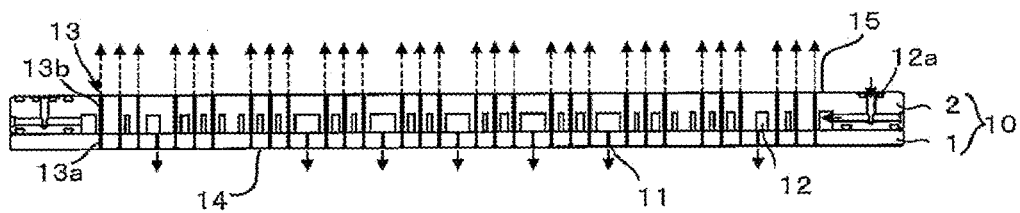
FIG. 2 is a diagram schematically illustrating a configuration of main parts of the plasma processing apparatus of FIG. 1.

As shown in FIG. 2, the shower head 100 is configured by a laminated body 10 in which two sheets of plate-like members having a lower member 1 and an upper member 2 disposed above the lower member 1 are laminated. The lower member 1 and the upper member 2 are made of, for example, aluminum whose surface is anodically oxidized.

A plurality of gas discharging holes 11 are formed in the lower member 1 of the laminated body 10 where the lower member 1 forms a facing surface 14 that faces the mounting table 202, and a gas flow passage 12 that communicates with the gas discharging holes 11 is formed between the lower member 1 and the upper member 2. As indicated by the arrow in FIGS. 1 and 2, the gas discharging holes 11 supply the gas toward the substrate (downside of FIGS. 1 and 2) in a shower pattern. A gas introducing unit 12a is provided at the peripheral portion of the laminated body 10 to introduce the gas into the gas flow passage 12.

A plurality of exhaust holes 13 are formed in the laminated body 10 so as to pass through the lower member 1 and the upper member 2 of the laminated body 10. As indicated by the dotted arrow in FIGS. 1 and 2, the exhaust holes 13 configure an exhaust mechanism that exhausts the gas so as to form a gas flow from the substrate side (lower side of the figures) toward the opposite side to the substrate (upper side of the figures). The diameter of a portion 13a of the exhaust holes 13 having a smaller diameter and formed in the lower member 1 shown in FIG. 2 is, for example, approximately 0.5 mm to 1.5 mm, and the diameter of a portion 13b having a larger diameter and formed in the upper member 2 is, for example, approximately 2.0 mm to 5.0 mm.

Figure 3:
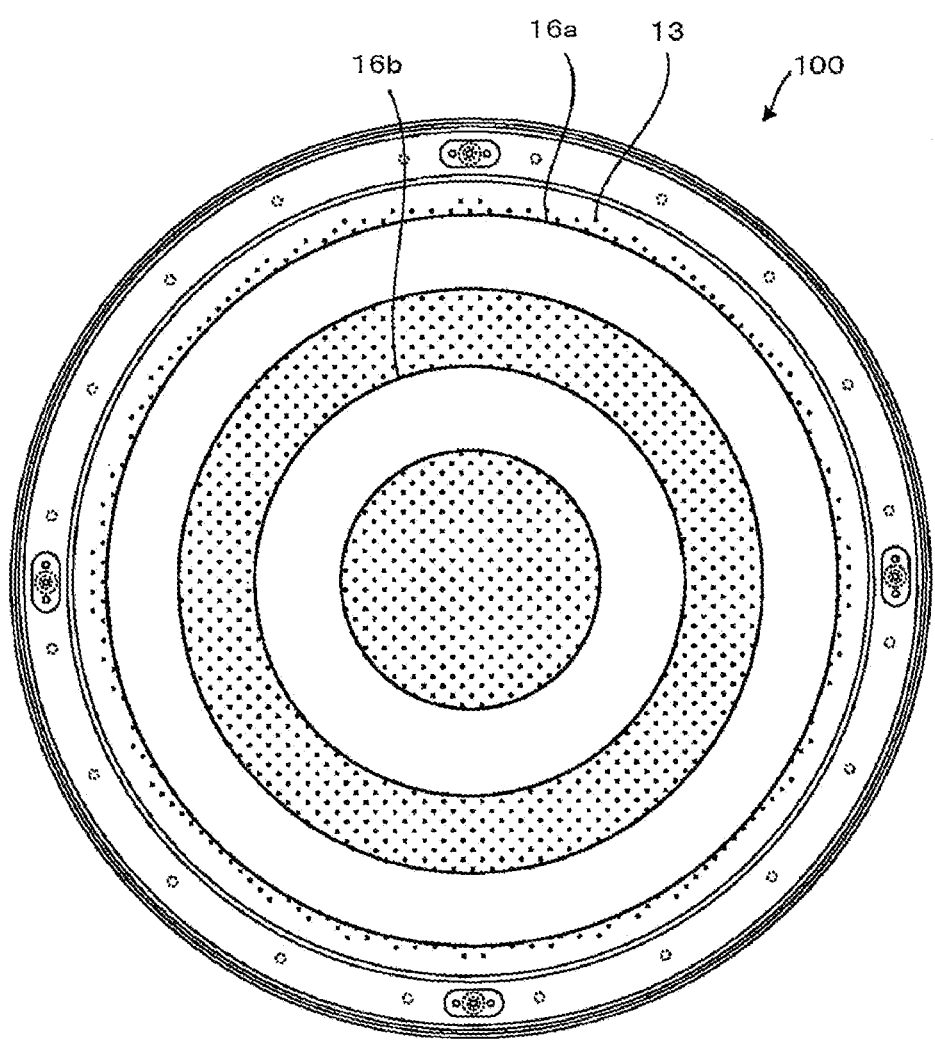
FIG. 3 is a diagram schematically illustrating a configuration of main parts of the plasma processing apparatus of FIG. 1.

FIG. 3 shows a planar configuration of the shower head 100 when viewed from above. As shown in FIG. 3, the exhaust holes 13 are substantially uniformly formed on the entire area of the shower head 100 except the peripheral portion of the shower head 100 which will function as a fixing part to which the processing chamber 201 is fixed. The number of the exhaust holes 13 is, for example, approximately 2000 to 2500 in case where the shower head 100 processes a semiconductor wafer having a diameter of 12 inches (300 mm) As shown in FIG. 3, in the exemplary embodiment, the external shape of the shower head 100 has an appearance of a disk shape conforming to that of the semiconductor wafer which is a target substrate. As shown in FIG. 3, plate-like bodies 16a and 16b which will be described below are disposed above the shower head 100.

As shown in FIG. 1, the gas introducing unit 12a of the shower head 100 is connected to a gas supply part 207 provided in the processing chamber 201. A predetermined processing gas (e.g., an etching gas) is supplied to the gas supply part 207 from a gas supply mechanism (not shown).

A cylindrical body 210 is provided above the shower head 100, and a vacuum pump (not shown) such as a turbomolecular pump is connected to the cylindrical body 210 through either an opening/closing control valve or an opening/closing mechanism. As described above, the inner part of the cylindrical body 210 serves as an exhaust path. In the exhaust path inside the cylindrical body 210, a plurality (two in the exemplary embodiment) of the circular plate-like bodies 16a and 16b made of a conductive material (for example, silicon, silicon carbide, or solid material of aluminum) are arranged to be faced to a rear surface 15 (a surface located opposite to the facing surface 14 that faces the mounting table 202) of the shower head 100. The plate-like bodies 16a and 16b are concentrically disposed as shown in FIG. 3.

The plate-like body 16a provided to be disposed at the peripheral portion of the shower head 100 is connected to a driving mechanism 161a shown at the left side of FIG. 1 through a connecting member 17a. The plate-like body 16a is movable up and down by the driving mechanism 161a independently from the plate-like body 16b.

In contrast, the plate-like body 16b provided closer to the center portion than the plate-like body 16a is connected to a driving mechanism 161b shown at the right side of FIG. 1 through a connecting member 17b. The plate-like body 16b is movable up and down by the driving mechanism 161b independently from the plate-like body 16a.

Changeover switches 18a and 18b are electrically connected to the plate-like bodies 16a and 16b, respectively. The plate-like bodies 16a and 16b may be set to be either an electrical ground state or a floating state by the changeover switches 18a and 18b.

As described above, the plate-like bodies 16a and 16b may move up and down by the driving mechanisms 161a and 161b to adjust the distance to the exhaust holes 13 of the shower head 100. The electrical state may be set to be an electrically grounded state or a floating state by the changeover switches 18a and 18b. By doing this, it is possible to control the leakage status of plasma from the processing space in the processing chamber 201 between the shower head 100 and the mounting table 202 toward the exhaust space on the rear surface 15 of the shower head 100.

That is, for example, when the plate-like bodies 16a and 16b are disposed at the lower side of FIG. 1 so as to be close to the exhaust holes 13, the plasma leakage from the exhaust holes 13 is physically and electrically suppressed. In the meantime, when the plate-like bodies 16a and 16b are disposed at the upper side of FIG. 1 so as to be spaced apart from the exhaust holes 13, the plasma leakage from the exhaust holes 13 is more allowed, as compared with a case where the plate-like bodies are close to the exhaust holes. Further, the status of the plasma may be controlled such that as the distance between the plate-like bodies 16a and 16b and the exhaust holes 13 becomes longer, the plasma leakage area becomes larger.

Furthermore, for example, when the plate-like body 16a is disposed at the upper side of FIG. 1 so as to be spaced apart from the exhaust holes 13 while the plate-like body 16b is disposed at the lower side of FIG. 1 so as to be close to the exhaust holes 13, the plasma leakage is suppressed at the center portion of the shower head 100 while the plasma leakage is allowed at the peripheral portion of the shower head 100. Accordingly, it is possible to partially control the plasma status such as plasma density at the center portion and the peripheral portion, respectively.

For example, there are many cases where the plasma density at the peripheral portion in the processing space tends to be lower than the density at the center portion. In this case, for example, if the plasma is leaked at the peripheral portion but not leaked at the center portion, electrons or ions existed at the center portion within the processing space move toward the peripheral portion so that the uniformity of the plasma density in the processing space is improved.

When a DC voltage is applied to the plasma in the processing space in order to control the plasma, for example, when the DC voltage is applied to the DC electrode disposed in the processing space, the plate-like bodies 16a and 16b may be connected to a ground potential to serve as ground electrodes for the DC voltage.

When plasma etching is performed for the semiconductor wafer by the plasma etching device 200, the semiconductor wafer is carried from the opening 205 into the processing chamber 201 to be disposed on the electrostatic chuck 203. Then, the semiconductor wafer is electrostatically adsorbed onto the electrostatic chuck 203. Subsequently, the opening 205 is closed and the inside of the processing chamber 201 maintains at a vacuum state up to a predetermined vacuum level by the vacuum pump.

Thereafter, a predetermined processing gas (e.g., an etching gas) having a predetermined flow rate is supplied from the gas supply part 207 to the gas introducing unit 12a of the shower head 100, and the processing gas is supplied to the semiconductor wafer in a shower pattern on the mounting table 202 through the gas discharging holes 11 via the gas flow passage 12 of the shower head 100.

After maintaining the pressure in the processing chamber 201 at a predetermined pressure, a high frequency power of 40 MHz is applied to the mounting table 202 as a high frequency power for generating plasma, for example. Accordingly, a high frequency electric field is generated between the shower head 100 serving as an upper electrode and the mounting table 202 serving as a lower electrode so that the etching gas is dissociated to become plasma. Simultaneously, as a high frequency power for injecting (biasing) ions, for example, a high frequency power of 3.2 MHz is applied to the mounting table 202. By doing this, a predetermined etching processing is performed on the semiconductor wafer by ions extracted from the plasma.

In the etching processing, the processing gas supplied through the gas discharging holes 11 of the shower head 100 in a shower pattern is dispersed in the shower head 100 and then exhausted through the plurality of the exhaust holes 13. Therefore, unlike the case where the gas is exhausted from the lower part of the processing chamber 201, the gas flow from the center portion toward the peripheral portion of the semiconductor wafer is not formed. Therefore, it is possible to supply the processing gas to the semiconductor wafer more uniformly.

As described above, by adjusting the position of the plate-like bodies 16a and 16b and changing their electrical status, the plasma in the processing space in the processing chamber 201 may or may not be leaked in an exhaust space inside the cylindrical body 210, such that the status of the plasma in the processing space can be controlled. By doing this, the plasma within the processing space may be uniformized and a uniform etching can be performed on the respective areas of the semiconductor wafer. That is, it is possible to improve the in-plain uniformity of the processing.

The above-mentioned plasma control may be automatically performed by providing a control mechanism that controls the movement of the plate-like bodies 16a and 16b by the driving mechanisms 161a and 161b and controls switching of the changeover switches 18a and 18b, based on measurement results from a measuring mechanism that measures a status of the plasma in the processing chamber 201, for example, based on results from a plasma monitor that detects the status of the plasma from the emitting excited status of the plasma.

When a predetermined plasma etching processing is completed, the application of the high frequency power and the supply of processing gas are stopped, and the semiconductor wafer is carried-out from the processing chamber 201 in a reverse order to the above-described order.

As described above, according to the plasma etching device 200 of the present exemplary embodiment, it is possible to more accurately control the status of plasma in the processing space according to a process condition.

In the plasma etching device 200, since the gas is exhausted through exhaust holes 13 provided in the shower head 100, unlike in a conventional device, it is not necessary to provide an exhaust path around the mounting table 202 or around shower head 100. Therefore, the diameter of the processing chamber 201 is allowed to be closer to the outer diameter of the semiconductor wafer which is a substrate to be processed, and an apparatus size may be minimized. The vacuum pump is provided at the upper side of the processing chamber 201 and gas is exhausted from a portion that is closer to the processing space of the processing chamber 201. Therefore, it is possible to efficiently exhaust the gas, and thus the volume of the vacuum pump can be reduced to further miniaturize the size of the apparatus.

As described above, although the exemplary embodiments of the present disclosure have been described, the present disclosure is not limited to the exemplary embodiments and may be variously modified. For example, in the above exemplary embodiment, an example in which two plate-like bodies 16a and 16b are arranged is described. However, the number of plate-like bodies is not limited to two, and any number of plate-like bodies is allowed. The shape of plate-like bodies is also not limited to a circular shape.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

According to the exemplary embodiments of the present disclosure, it is possible to provide a plasma processing apparatus that is capable of more accurately controlling the plasma as compared with the related art.

What is claimed is:

1. A plasma processing apparatus, comprising:
   a shower head provided within a processing chamber to be faced with a mounting table for mounting a substrate and configured to supply gas from a plurality of gas discharging holes provided on a facing surface facing the mounting table toward the substrate in a shower pattern;
   a plurality of exhaust holes configured to pass through an opposite surface located at an opposite side to the facing surface of the shower head;
   a plurality of annular plate-like bodies each having no through hole and disposed above the shower head in parallel with the opposite surface of the shower head in an exhaust space communicating with the exhaust holes distributed at the opposite surface of the shower head and made of a conductive material; and
   a plurality of moving units configured to move the plurality of annular plate-like bodies, respectively and independently, to change a distance between each of the plurality of annular plate-like bodies and the exhaust holes such that one or more of the plurality of annular plate-like bodies become close to the exhaust holes or spaced apart from the exhaust holes, thereby suppressing or allowing a leakage status of plasma directed from a processing space provided within the processing chamber between the shower head and the mounting table toward the exhaust space provided on the opposite surface of the shower head, wherein the plurality of annular plate-like bodies each having a planar top surface and a planar lower surface are configured to be concentrically disposed at a predetermined interval with a gap inbetween in a radial direction of the shower head, and each of the plurality of annular plate-like bodies is connected to the plurality of moving units, respectively.

2. The apparatus of claim 1, further comprising:
a changeover switch that switches an electrical status of each of the annular plate-like bodies.

3. The apparatus of claim 2, wherein the changeover switch is configured to switch an electrical ground state of each of the annular plate-like bodies to a floating state.

4. The apparatus of claim 2, wherein each of the annular plate-like bodies is connected to the different changeover switches.

5. The apparatus of claim 4, wherein each of the annular plate-like bodies is configured by any of silicon, silicon carbide, or solid material of aluminum.

6. The apparatus of claim 1, wherein each of the annular plate-like bodies is configured by any of silicon, silicon carbide, or solid material of aluminum.

7. The apparatus of claim 1, further comprising:
a DC electrode disposed in the processing space of the processing chamber,
wherein a DC voltage is applied to the DC electrode, and each of the annular plate-like bodies is configured to be connected to a ground potential to serve as a ground electrode for the DC voltage.

8. The apparatus of claim 2, wherein each of the annular plate-like bodies is configured by any of silicon, silicon carbide, or solid material of aluminum.

9. The apparatus of claim 1, wherein the shower head is configured by a laminated body in which two sheets of plate-like members having a lower member and an upper member disposed on the lower member are laminated.

10. The apparatus of claim 9, wherein each of the plurality of exhaust holes is configured to pass through the lower member and the upper member.

11. The apparatus of claim 9, wherein each of the plurality of exhaust hole includes a portion having a relatively smaller diameter and formed in the lower member and a portion having a relatively larger diameter and formed in the upper member.

12. The apparatus of claim 1, wherein at least one of the annular plate-like bodies is provided above the mounting table.

* * * * *